United States Patent
Tahara et al.

(10) Patent No.: US 9,818,543 B2
(45) Date of Patent: Nov. 14, 2017

(54) ELECTRONIC COMPONENT, METHOD OF PRODUCING THE SAME, AND CIRCUIT SUBSTRATE

(71) Applicant: Taiyo Yuden Co., Ltd., Tokyo (JP)

(72) Inventors: Mikio Tahara, Tokyo (JP); Tomoaki Nakamura, Tokyo (JP); Kayoko Hirayama, Tokyo (JP); Reiko Shimoda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/252,906

(22) Filed: Aug. 31, 2016

(65) Prior Publication Data

US 2017/0154731 A1  Jun. 1, 2017

(30) Foreign Application Priority Data

Dec. 1, 2015  (JP) .................................. 2015-234526

(51) Int. Cl.
| | |
|---|---|
| *H01G 4/00* | (2006.01) |
| *H01G 4/224* | (2006.01) |
| *H01G 4/30* | (2006.01) |
| *H01G 4/232* | (2006.01) |
| *H05K 1/18* | (2006.01) |

(52) U.S. Cl.
CPC .............. *H01G 4/30* (2013.01); *H01G 4/232* (2013.01); *H05K 1/18* (2013.01); *H05K 1/181* (2013.01); *H05K 2201/10015* (2013.01); *H05K 2201/10636* (2013.01)

(58) Field of Classification Search
CPC .................................. H01G 5/01; H01G 5/014
See application file for complete search history.

(56) References Cited

U.S. PATENT DOCUMENTS

2010/0290172 A1* 11/2010 Motoki .................. H01G 4/232
   361/305
2014/0085767 A1*  3/2014 Kang ...................... H01G 4/12
   361/301.4

FOREIGN PATENT DOCUMENTS

JP       2013026392 A       2/2013

* cited by examiner

*Primary Examiner* — Hoa C Nguyen
(74) *Attorney, Agent, or Firm* — Saliwanchik, Lloyd & Eisenschenk

(57) ABSTRACT

An electronic component includes: a chip having first and second end surfaces oriented in a direction of a first axis, first and second main surfaces oriented in a direction of a second axis orthogonal to the first axis, first and second side surfaces oriented in a direction of a third axis orthogonal to the first and second axes, and first and second external electrodes respectively covering the first and second end surfaces and each extending to the first and second main surfaces and side surfaces; a covering portion covering the chip from the first main surface toward the second main surface; and exposed portions provided to the second main surface, including regions where the first and second external electrodes are exposed without being covered with the covering portion, and being pushed out toward the first main surface along ridges connecting the first and second end surfaces and side surfaces.

6 Claims, 12 Drawing Sheets

ELECTRONIC COMPONENT, METHOD OF PRODUCING THE SAME, AND CIRCUIT SUBSTRATE

CROSS REFERENCE TO RELATED APPLICATION

This application claims the benefit under 35 U.S.C. §119 of Japanese Patent Application No. 2015-234526, filed Dec. 1, 2015, which is herein incorporated by reference in its entirety.

BACKGROUND OF THE INVENTION

The present invention relates to an electronic component including a pair of external electrodes, a method of producing the electronic component, and a circuit substrate.

Electronic components such as multi-layer ceramic capacitors are incorporated into an electronic device after being soldered to a wiring pattern of a circuit substrate by using a reflow furnace or the like. In recent years, accompanied by miniaturization and achievement of high performance of the electronic devices, there is a demand for reduction in mount space for the electronic components on the circuit substrate.

Japanese Patent Application Laid-open No. 2013-026392 discloses a technology capable of reducing a mount space for electronic components (multi-layer ceramic capacitors) on a circuit substrate. In each electronic component, with an opposed surface being held by adhesion, the opposed surface facing the circuit substrate, five surfaces other than the opposed surface are coated with resin. In this electronic component, solder is not jointed to the five surfaces other than the opposed surface.

Therefore, in the technology according to Japanese Patent Application Laid-open No. 2013-026392, when the opposed surface of the electronic component is soldered to the circuit substrate, solder does not wet up from the opposed surface. This suppresses wet spread of the solder along the circuit substrate. As a result, a mount space for the electronic components on the circuit substrate can be reduced.

BRIEF SUMMARY

However, in the technology according to Japanese Patent Application Laid-open No. 2013-026392, a joint area of the solder in each of the electronic component and the circuit substrate is made small. As a result, a joint strength between the electronic component and the circuit substrate is lowered. This makes it difficult to obtain high reliability. For that reason, there is a demand for a technology capable of reducing a mount space while ensuring a sufficient joint strength between a multi-layer ceramic capacitor and a circuit substrate.

In view of the circumstances as described above, it is desirable to provide an electronic component capable of reducing a mount space while ensuring a sufficient joint strength by solder, a method of producing the electronic component, and a circuit substrate.

According to an embodiment of the present invention, there is provided an electronic component including a chip, a covering portion, and exposed portions.

The chip has a first end surface and a second end surface, the first end surface and the second end surface being oriented in a direction of a first axis, a first main surface and a second main surface, the first main surface and the second main surface being oriented in a direction of a second axis orthogonal to the first axis, a first side surface and a second side surface, the first side surface and the second side surface being oriented in a direction of a third axis orthogonal to the first axis and the second axis, and a first external electrode and a second external electrode, the first external electrode and the second external electrode respectively covering the first end surface and the second end surface and each extending to the first main surface, the second main surface, the first side surface, and the second side surface.

The covering portion covers the chip from the first main surface toward the second main surface.

The exposed portions are provided to the second main surface of the chip, include regions where the first external electrode and the second external electrode are exposed without being covered with the covering portion, and are pushed out toward the first main surface along ridges connecting the first and second end surfaces to the first and second side surfaces.

In this configuration, the exposed portions that are not covered with the covering portion are formed on the second main surface side of the first external electrode and the second external electrode.

When the electronic component is mounted to a substrate, the exposed portions of the first external electrode and the second external electrode are soldered to the substrate, with the second main surface facing the substrate. At that time, wet-up of the solder at the first external electrode and the second external electrode is blocked by the covering portion, and the solder stays at the exposed portions of the first external electrode and the second external electrode.

In such a manner, in this electronic component, since the amount of wet-up of the solder at the first external electrode and the second external electrode can be suppressed to be small, the amount of wet spread of the solder on the substrate is also suppressed to be small. As a result, the mount space for the electronic component can be reduced.

Further, in this electronic component, at the four corners on the second main surface side, surface areas of the exposed portions of the first and second external electrodes are increased. Therefore, the electronic component is rigidly jointed to the substrate via the solder at the four corners, and a high joint strength with respect to the substrate is obtained.

The covering portion may cover the entire region of the first main surface and expose the entire region of the second main surface.

In this configuration, the covering portion can be easily formed by a dip coating method.

The covering portion may have a flat surface on the first main surface, the flat surface being perpendicular to the second axis.

In the electronic component, the flat surface of the covering portion is provided on the first main surface, which is opposite to the second main surface facing the substrate at the time of mounting. Therefore, when the electronic component is mounted, with the flat surface of the covering portion being held by suction, the second main surface of the electronic component can be caused to face the substrate. In such a manner, the electronic component can be easily mounted to the substrate.

The chip may further include first internal electrodes and second internal electrodes, the first internal electrodes being connected to the first external electrode, the second internal electrodes being connected to the second external electrode, the first internal electrodes and the second internal electrodes being alternately disposed along the second axis.

In this configuration, a multi-layer ceramic capacitor capable of reducing a mount space is obtained.

According to another embodiment of the present invention, there is provided a method of producing an electronic component, the method including: preparing a chip, the chip having a first end surface and a second end surface, the first end surface and the second end surface being oriented in a direction of a first axis, a first main surface and a second main surface, the first main surface and the second main surface being oriented in a direction of a second axis orthogonal to the first axis, a first side surface and a second side surface, the first side surface and the second side surface being oriented in a direction of a third axis orthogonal to the first axis and the second axis, and a first external electrode and a second external electrode, the first external electrode and the second external electrode respectively covering the first end surface and the second end surface and each extending to the first main surface, the second main surface, the first side surface, and the second side surface; immersing the chip in an uncured resin from the first main surface toward the second main surface, to coat the chip with the uncured resin such that the first external electrode and the second external electrode are exposed on the second main surface; and curing the uncured resin coating the chip.

A flat surface may be formed on a portion of the uncured resin on the first main surface, the flat surface being perpendicular to the second axis.

In this configuration, since the covering portion can be formed by a dip coating method, it is possible to easily produce an electronic component capable of reducing a mount space while ensuring a sufficient joint strength by solder.

Further, since the flat surface is provided to the uncured resin, an easily-mountable electronic component is obtained.

The curing the uncured resin may include precuring the uncured resin to obtain a precured resin, and postcuring the precured resin.

In this case, the chip bonded to a tape may be prepared.

The chip coated with the precured resin may be peeled off from the tape.

With such configurations, the uncured resin can be simultaneously applied to a plurality of chips bonded to a single tape. As a result, the electronic component can be produced more efficiently.

Further, since the uncured resin is precured before the chips are peeled off from the tape, the chips peeled off from the tape can be prevented from adhering to each other.

According to another embodiment of the present invention, there is provided a circuit substrate including: a substrate having a mount surface; and an electronic component mounted on the mount surface.

The electronic component includes a chip, a covering portion, and exposed portions.

The chip has a first end surface and a second end surface, the first end surface and the second end surface being oriented in a direction of a first axis, a first main surface and a second main surface, the first main surface and the second main surface being oriented in a direction of a second axis orthogonal to the first axis, a first side surface and a second side surface, the first side surface and the second side surface being oriented in a direction of a third axis orthogonal to the first axis and the second axis, and a first external electrode and a second external electrode, the first external electrode and the second external electrode respectively covering the first end surface and the second end surface and each extending to the first main surface, the second main surface, the first side surface, and the second side surface.

The covering portion covers the chip from the first main surface toward the second main surface.

The exposed portions are provided to the second main surface of the chip, include regions where the first external electrode and the second external electrode are exposed without being covered with the covering portion, and are pushed out toward the first main surface along ridges connecting the first and second end surfaces to the first and second side surfaces.

In the electronic component, the second main surface is disposed to face the mount surface, and the first external electrode and the second external electrode are soldered to the mount surface at the exposed portions.

With this configuration, the mount space for the electronic component is reduced, and a circuit substrate that enables miniaturization and high integration can be provided. Further, in the circuit substrate, a sufficient joint strength between the substrate and the electronic component by the solder can be ensured, and high reliability is thus obtained.

It is possible to provide an electronic component capable of reducing a mount space while ensuring a sufficient joint strength by solder, a method of producing the electronic component, and a circuit substrate.

These and other objects, features and advantages of the present invention will become more apparent in light of the following detailed description of embodiments thereof, as illustrated in the accompanying drawings.

DETAILED DESCRIPTION

Hereinafter, an embodiment of the present invention will be described with reference to the drawings.

In the figures, an X axis, a Y axis, and a Z axis orthogonal to one another are shown as appropriate. The X axis, the Y axis, and the Z axis are common in all figures.

1. Overall Configuration of Multi-Layer Ceramic Capacitor 1

Figure 1:
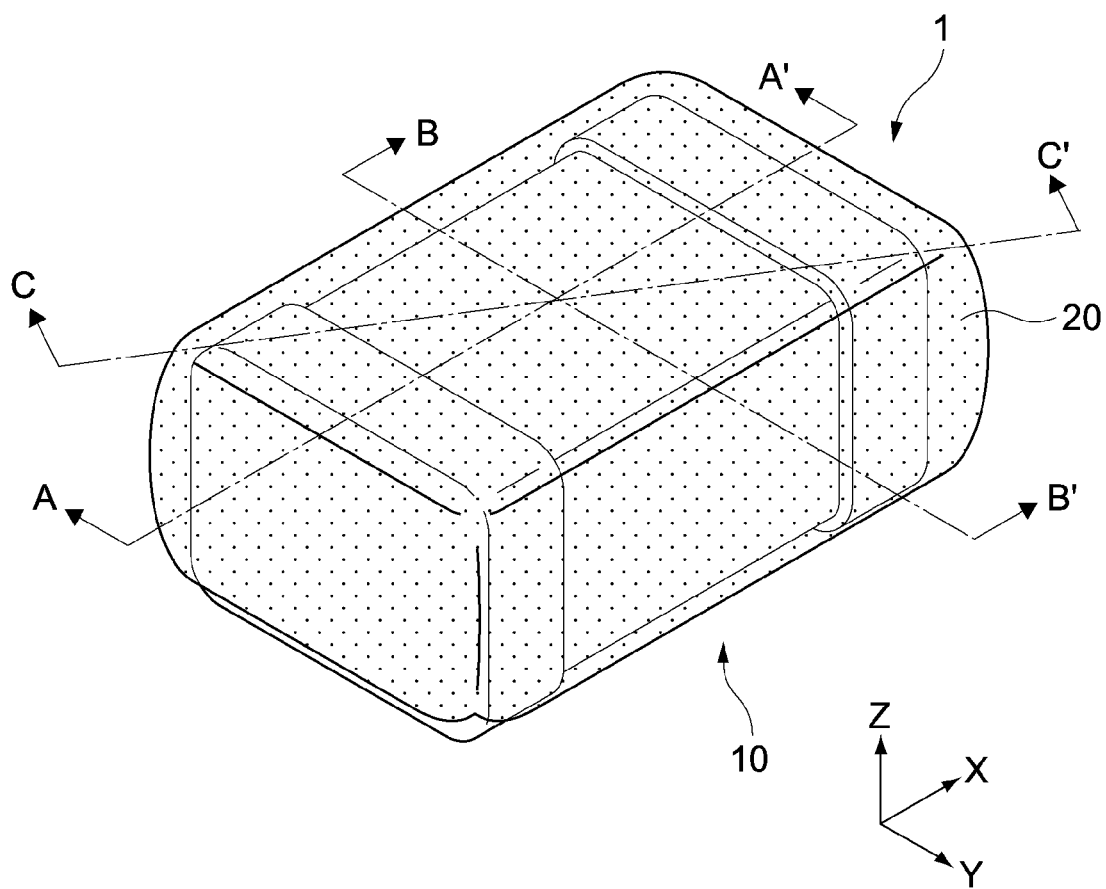
FIG. 1 is a perspective view of a multi-layer ceramic capacitor according to one embodiment of the present invention.

FIG. 1 is a perspective view of a multi-layer ceramic capacitor 1 according to one embodiment of the present invention.

The multi-layer ceramic capacitor 1 includes a chip 10 and a covering portion 20.

The chip 10 is formed as a main body of the multi-layer ceramic capacitor 1. The covering portion 20 is made of resin. The covering portion 20 covers the chip 10 from the top to the bottom in a Z-axis direction and has an opening on the bottom in the Z-axis direction.

The chip 10 has all functions of the multi-layer ceramic capacitor 1 and can be used alone as a capacitor. However, the multi-layer ceramic capacitor 1 includes the covering portion 20 in order to reduce a mount space more than the simple chip 10.

Further, the covering portion 20 also has a function of protecting the chip 10. The covering portion 20 prevents the chip 10 from being damaged by external impacts and the like and improves resistance to moisture of the multi-layer ceramic capacitor 1.

The resin for forming the covering portion 20 can be selected as appropriate in accordance with performance expected for the covering portion 20, for example, a production process or usage environment of an electronic device into which the multi-layer ceramic capacitor 1 is incorporated. For example, when the multi-layer ceramic capacitor 1 is immersed in a chemical liquid in a production process of an electronic device, resin having high resistance to the chemical liquid is selected.

For the resin for forming the covering portion 20, a thermosetting resin such as an epoxy resin, a polyimid resin, a phenolic resin, and an amino resin, an ultraviolet curable resin of a radical polymerization type, of a cation polymerization type, and the like can be selected. In this embodiment, the covering portion 20 is made of thermosetting resin.

In FIG. 1 and the like, the covering portion 20 is made of transparent or translucent resin, and the chip 10 is viewable through the covering portion 20.

However, the covering portion 20 may be made of opaque resin or may be colored. In those cases, a portion covered with the covering portion 20 in the chip 10 is hardly viewed.

Figure 2:
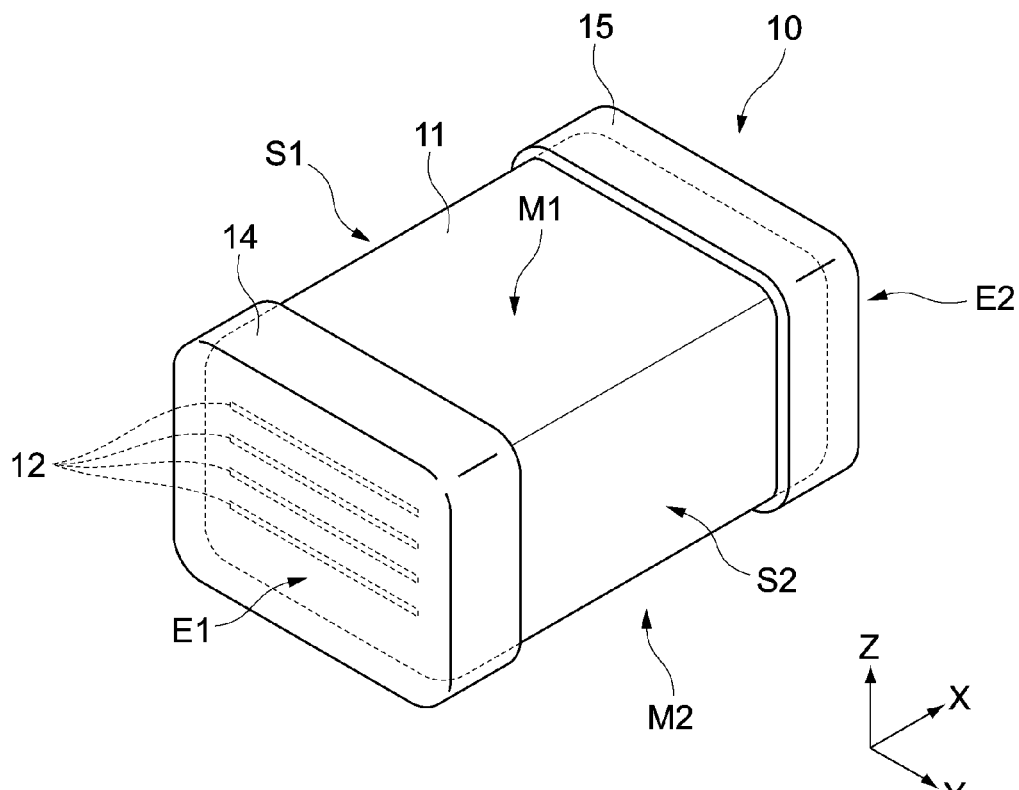
FIG. 2 is a perspective view of a simple chip of the multi-layer ceramic capacitor.

FIG. 2 is a perspective view of the simple chip 10, showing the multi-layer ceramic capacitor 1 without the covering portion 20.

The chip 10 includes a body 11, a first external electrode 14, and a second external electrode 15. The body 11 is formed as a hexahedron with six surfaces, i.e., main surfaces M1 and M2 oriented in the Z-axis direction, end surfaces E1 and E2 oriented in an X-axis direction, and side surfaces S1 and S2 oriented in a Y-axis direction. The first external electrode 14 covers the first end surface E1 of the body 11, and the second external electrode 15 covers the second end surface E2 of the body 11.

The body 11 may be rounded as a whole, and the main surfaces M1 and M2, the end surfaces E1 and E2, and the side surfaces S1 and S2 are not necessarily distinguished clearly.

More specifically, all of the main surfaces M1 and M2, the end surfaces E1 and E2, and the side surfaces S1 and S2 of the body 11 only need to include at least portions perpendicular to the respective axes described above, and may be flat surfaces or curved surfaces. Further, ridges connecting the respective surfaces of the body 11 may be chamfered.

The body 11 is made of dielectric ceramics. In order that the multi-layer ceramic capacitor 1 obtains a large capacitance, the body 11 is desirably made of dielectric ceramics having a high dielectric constant. Examples of the dielectric ceramics having a high dielectric constant include a polycrystal of a barium titanate ($BaTiO_3$) based material, i.e., a polycrystal having a Perovskite structure containing barium (Ba) and titanium (Ti).

The first and second external electrodes 14 and 15 are formed from a good conductor. Examples of the good conductor for forming the first and second external electrodes 14 and 15 include metal mainly containing nickel (Ni), copper (Cu), palladium (Pd), platinum (Pt), silver (Ag), gold (Au), or the like, or an alloy of those metals can be used. The first and second external electrodes 14 and 15 may have a single-layer structure or multi-layer structure. The multi-layer structure may be formed as a double-layer structure including a base film and a surface film, or a three-layer structure including a base film, an intermediate film, and a surface film, for example.

The base film can be a baked film made of metal mainly containing nickel, copper, palladium, platinum, silver, gold, or the like, or an alloy of those metals, for example.

The intermediate film can be a plating film made of metal mainly containing platinum, palladium, gold, copper, nickel, or the like, or an alloy of those metals, for example.

The surface film can be a plating film made of metal mainly containing copper, tin, palladium, gold, zinc, or the like, or an alloy of those metals, for example.

Figure 3:
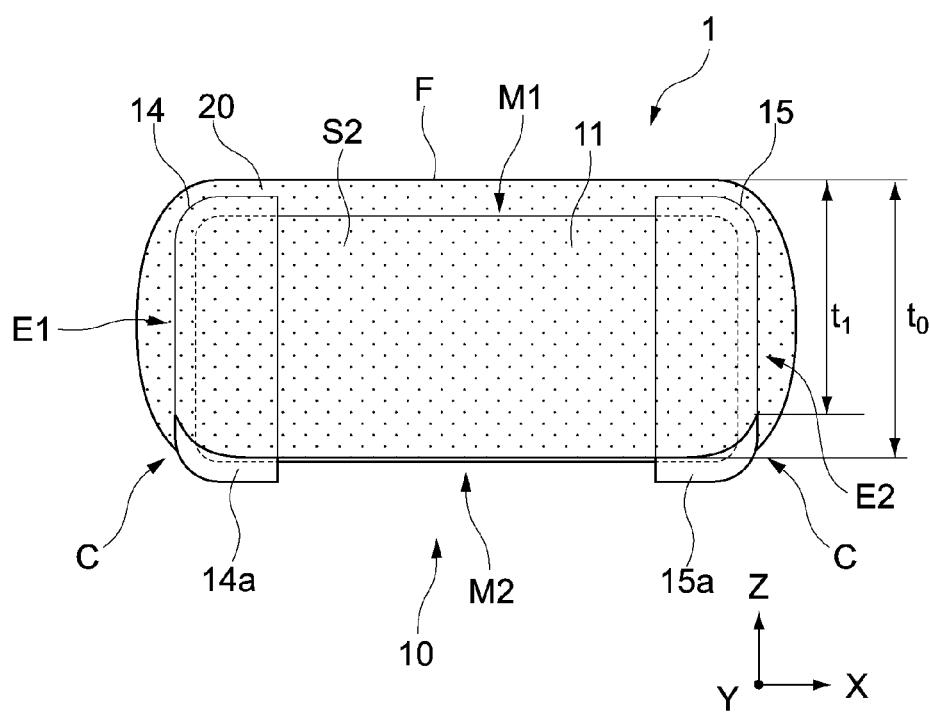
FIG. 3 is a side view of the multi-layer ceramic capacitor.
Figure 4:
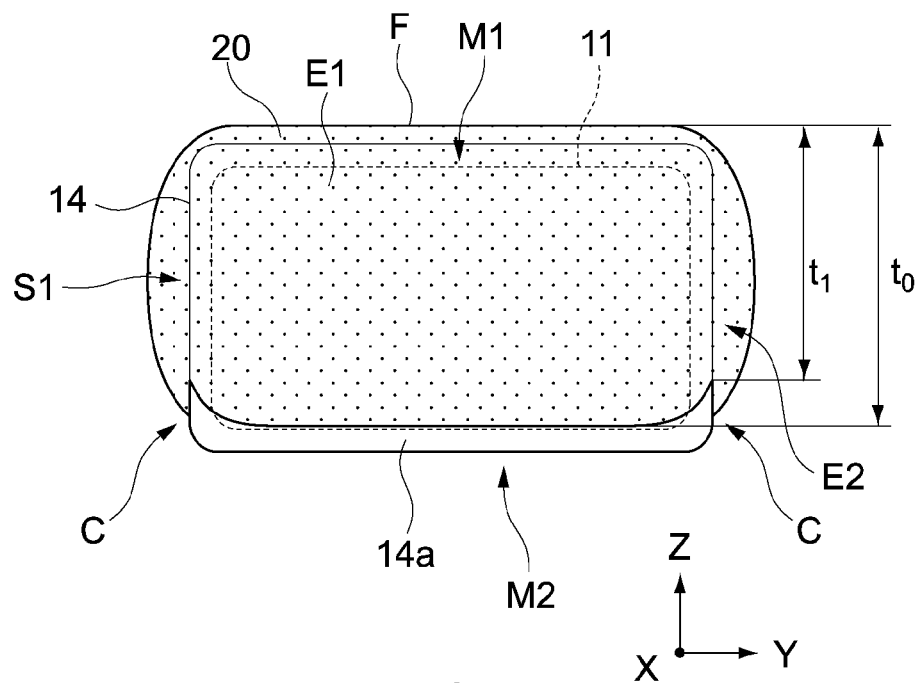
FIG. 4 is an end view of the multi-layer ceramic capacitor.

FIGS. 3 and 4 are views each showing the multi-layer ceramic capacitor 1. FIG. 3 shows the multi-layer ceramic capacitor 1 when viewed from the second side surface S2. FIG. 4 shows the multi-layer ceramic capacitor 1 when viewed from the first end surface E1.

The covering portion 20 covers all regions of the chip 10, except for the bottom portion in the Z-axis direction. In other words, the covering portion 20 covers five surfaces, i.e., the first main surface M1, the end surfaces E1 and E2, and the side surfaces S1 and S2 and exposes the second main surface M2. As a result, exposed portions 14a and 15a that are exposed without being covered with the covering portion 20 are formed on the bottom side of the first and second external electrodes 14 and 15 in the Z-axis direction.

When the multi-layer ceramic capacitor 1 is mounted on a mount surface 101 of a substrate 100 (see FIGS. 9 and 10), the exposed portions 14a and 15a of the first and second external electrodes 14 and 15 are connected to the mount surface 101 via solder H, with the second main surface M2 facing the mount surface 101.

So, before being mounted on the mount surface 101 of the substrate 100, the multi-layer ceramic capacitor 1 is necessarily disposed with the first main surface M1 facing up in the Z-axis direction and the second main surface M2 facing down in the Z-axis direction. The first main surface M1 is to be held by suction with a suction nozzle of a mount device. The second main surface M2 is to be caused to face the mount surface 101 of the substrate 100.

In this regard, the five surfaces of the multi-layer ceramic capacitor 1 except for the second main surface M2, i.e., the first main surface M1, the end surfaces E1 and E2, and the side surfaces S1 and S2, are all covered with the covering portion 20.

As a result, in the multi-layer ceramic capacitor 1, the orientation of the second main surface M2 is easily visible. Therefore, when the orientation of the multi-layer ceramic capacitor 1 is examined visually or automatically (by image processing etc.) before the mounting, it is possible to more easily and reliably detect a multi-layer ceramic capacitor 1 whose second main surface M2 does not face down in the Z-axis direction.

Further, a flat surface F perpendicular to the Z axis is formed on the first main surface M1 of the covering portion 20.

As a result, in the multi-layer ceramic capacitor 1 at the time of the mounting, the flat surface F on the first main surface M1 facing up in the Z-axis direction can be successfully held by suction with the suction nozzle of the mount device. The suction nozzle holding the flat surface F of the covering portion 20 by suction can cause the second main surface M2 of the multi-layer ceramic capacitor 1 to face an optimal position of the mount surface 101 of the substrate 100.

In such a manner, the multi-layer ceramic capacitor 1 can be mounted also when the covering portion 20 is provided, as in the case where the covering portion 20 is not provided.

Additionally, the covering portion 20 is recessed upward in the Z-axis direction at four ridges connecting the end surfaces E1 and E2 and the side surfaces S1 and S2. In other words, comparing dimensions of the covering portion 20 extending from the flat surface F downward in the Z-axis direction along the end surfaces E1 and E2 and the side surfaces S1 and S2, a dimension $t_1$ at the ridges is smaller than a dimension $t_0$ at a portion other than the ridges.

Thus, at four corners C on the bottom of the multi-layer ceramic capacitor 1 in the Z-axis direction, the exposed portions 14a and 15a of the first and second external electrodes 14 and 15 are pushed out toward the first main surface M1 and extend to a relatively high position in the Z-axis direction. In other words, in the multi-layer ceramic capacitor 1, the first and second external electrodes 14 and 15 are exposed to a large extent at the corners C.

Figure 5:
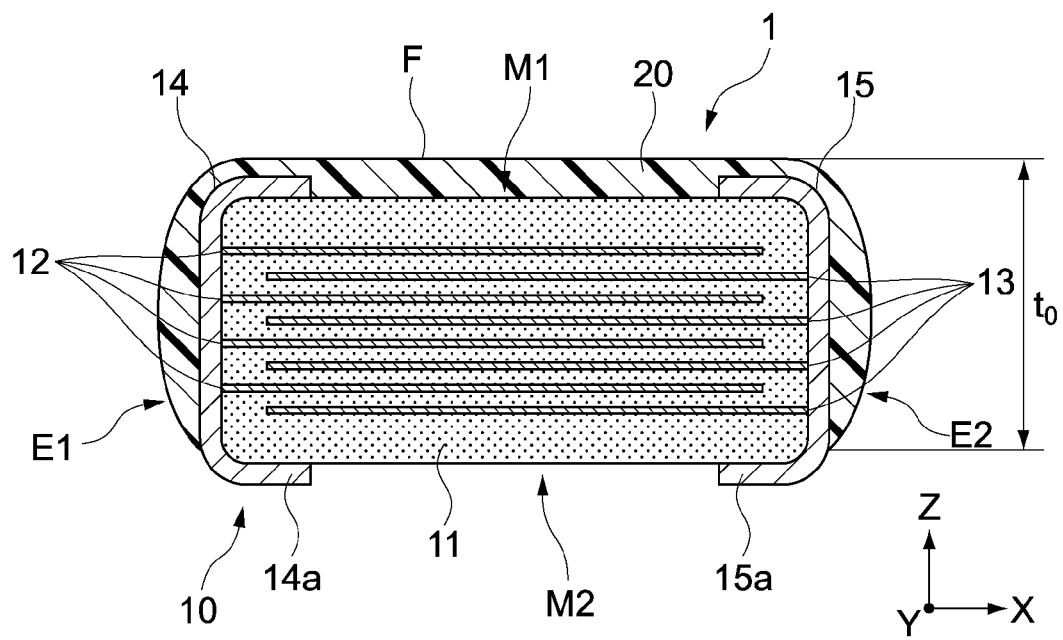
FIG. 5 is a cross-sectional view of the multi-layer ceramic capacitor taken along the A-A' line of FIG. 1.
Figure 6:
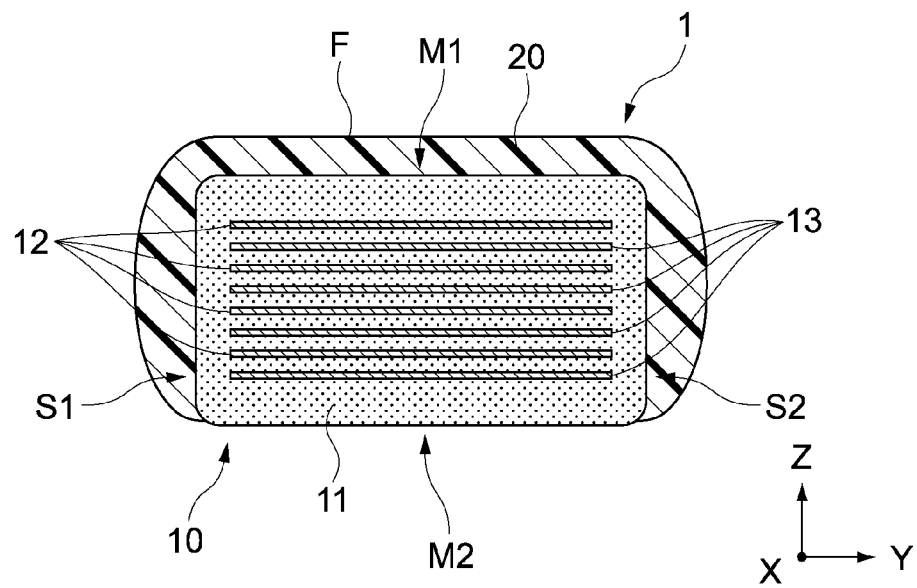
FIG. 6 is a cross-sectional view of the multi-layer ceramic capacitor taken along the B-B' line of FIG. 1.
Figure 7:
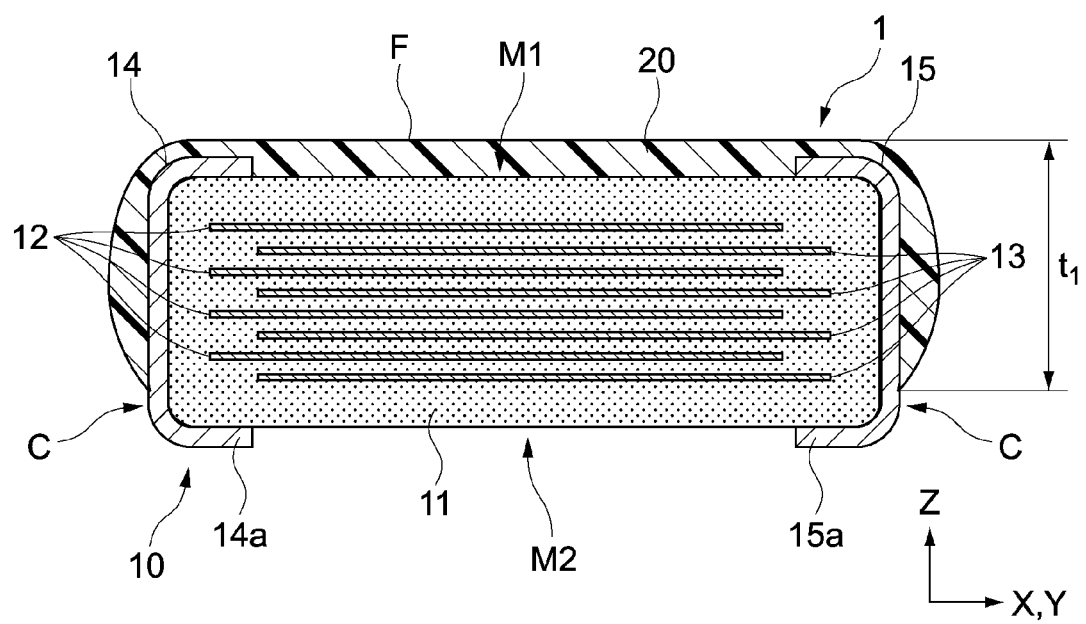
FIG. 7 is a cross-sectional view of the multi-layer ceramic capacitor taken along the C-C' line of FIG. 1.

FIGS. 5 to 7 are cross-sectional views of the multi-layer ceramic capacitor 1. FIG. 5 shows a cross section parallel to an X-Z plane taken along the A-A' line of FIG. 1. FIG. 6 shows a cross section parallel to a Y-Z plane taken along the B-B' line of FIG. 1. FIG. 7 shows a cross section including a diagonal line of the main surfaces M1 and M2 taken along the C-C' line of FIG. 1.

The cross section of the multi-layer ceramic capacitor 1 shown in FIG. 7 is a cross section taken along a ridge connecting the first end surface E1 and the first side surface S1 and a ridge connecting the second end surface E2 and the second side surface S2. FIG. 7 shows the corners C, at which the dimension $t_1$ of the covering portion 20 in the Z-axis direction in FIG. 7 is smaller than the dimension $t_0$ of the covering portion 20 in the Z-axis direction in FIGS. 5 and 6.

Referring to FIGS. 5 to 7, a detailed configuration of the chip 10 will be described.

The body 11 of the chip 10 includes first internal electrodes 12 and second internal electrodes 13. The first and second internal electrodes 12 and 13 are alternately disposed along the Z-axis direction while sandwiching layers of dielectric ceramics. The first internal electrodes 12 are connected to the first external electrode 14 and are apart from the second external electrode 15. The second internal electrodes 13 are connected to the second external electrode 15 and are apart from the first external electrode 14.

The first and second internal electrodes 12 and 13 are each formed from a good conductor and each function as an internal electrode of the multi-layer ceramic capacitor 1. Examples of the good conductor include a metal material containing nickel, copper, palladium, platinum, silver, or gold, or an alloy of those metals.

With such a configuration of the chip 10, when a voltage is applied between the first external electrode 14 and the second external electrode 15 in the multi-layer ceramic capacitor 1, a voltage is applied to the layers of dielectric ceramics between the first internal electrodes 12 and the second internal electrodes 13. As a result, in the multi-layer ceramic capacitor 1, charge corresponding to the voltage applied between the first external electrode 14 and the second external electrode 15 is stored.

It should be noted that the configuration of the chip 10 is not limited to a specific configuration, and a known configuration can be employed as appropriate. For example, the number of first and second internal electrodes 12 and 13 can be determined as appropriate in accordance with the size and performance expected for the multi-layer ceramic capacitor 1.

2. Mounting of Multi-Layer Ceramic Capacitor 1

The multi-layer ceramic capacitor 1 is mounted on the mount surface 101 of the substrate 100 by using the solder H. On the substrate 100, various electronic components other than the multi-layer ceramic capacitor 1 can be mounted as needed. The substrate 100 is integrated with an electronic component such as the multi-layer ceramic capacitor 1, to form a single circuit substrate.

Figure 8:
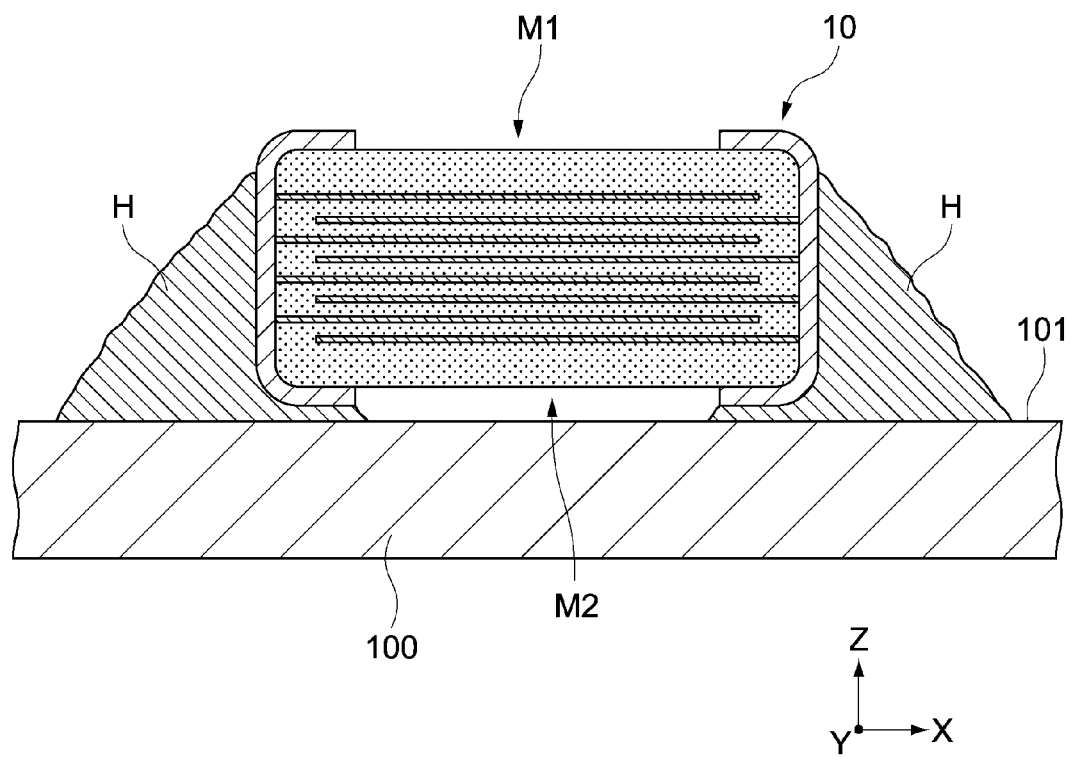
FIG. 8 is a cross-sectional view showing a state where the simple chip of the multi-layer ceramic capacitor is mounted.

FIG. 8 shows a reference example of this embodiment, showing a state where the simple chip 10 provided with no covering portion 20 is mounted on the mount surface 101 of the substrate 100.

The chip 10 shown in FIG. 8 is connected to the mount surface 101 of the substrate 100 by the solder H at the first and second external electrodes 14 and 15. The solder H wets up to the vicinity of the first main surface M1 at upper ends of the first and second external electrodes 14 and 15 of the chip 10 in the Z-axis direction, and forms fillets.

As the amount of wet-up of the solder H at the first and second external electrodes 14 and 15 is larger, the solder H spreads more widely along the mount surface 101 of the substrate 100. In this regard, in the simple chip 10 shown in FIG. 8, the amount of wet-up of the solder H at the first and second external electrodes 14 and 15 is large, so that the amount of wet spread of the solder H on the mount surface 101 of the substrate 100 is also large.

In such a manner, when the simple chip 10 is mounted on the mount surface 101 of the substrate 100, a larger mount space is necessary in consideration of the amount of wet spread of the solder H on the mount surface 101 of the substrate 100.

Figure 9:
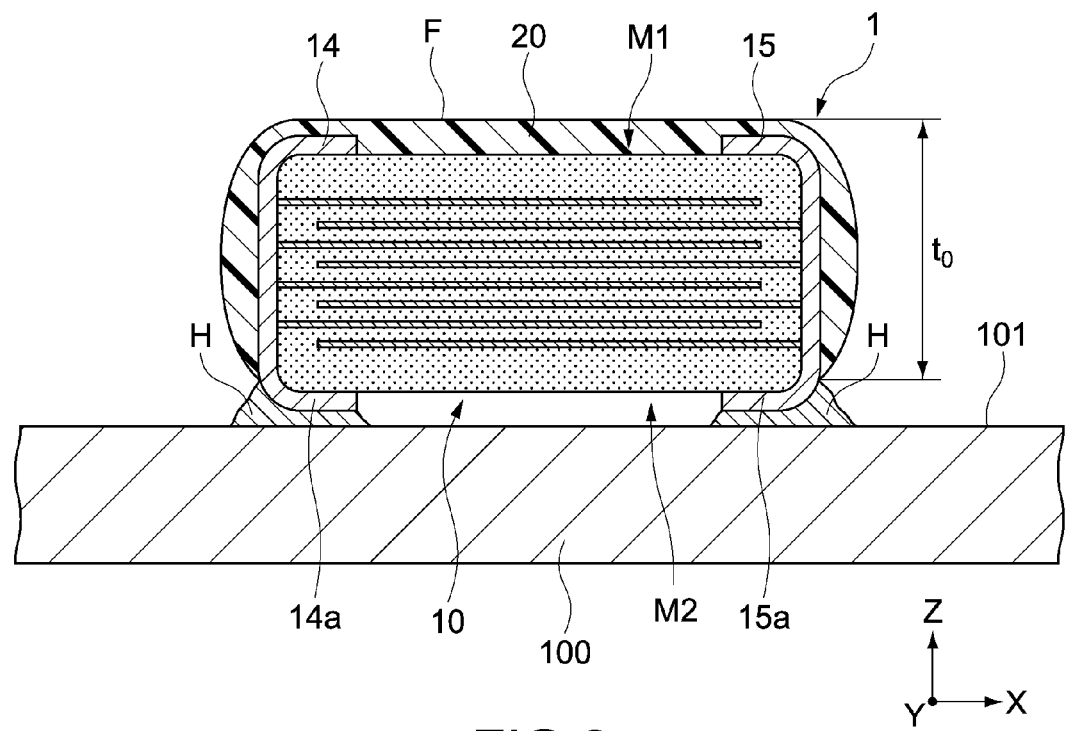
FIG. 9 is a cross-sectional view of the multi-layer ceramic capacitor taken along the A-A' line of FIG. 1 in a mounted state.
Figure 10:
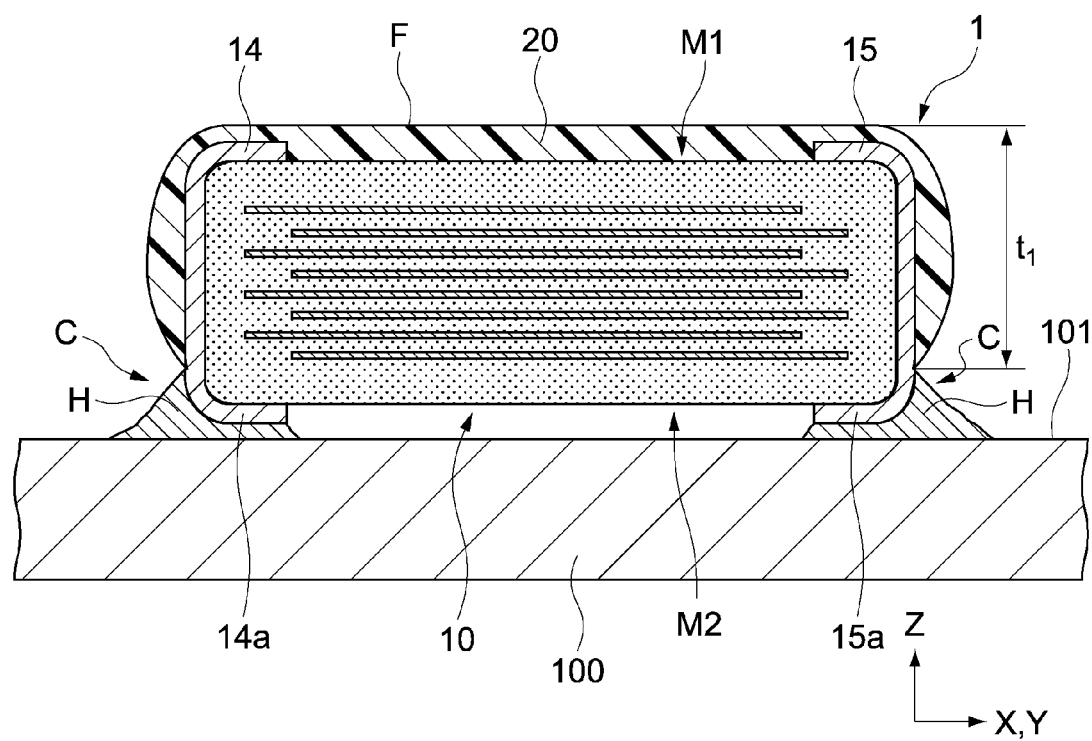
FIG. 10 is a cross-sectional view of the multi-layer ceramic capacitor taken along the C-C' line of FIG. 1 in the mounted state.

FIGS. 9 and 10 each show a state where the multi-layer ceramic capacitor 1 according to this embodiment is mounted on the mount surface 101 of the substrate 100. FIG. 9 shows a cross section taken along the A-A' line of FIG. 1. FIG. 10 shows a cross section taken along the C-C' line of FIG. 1.

The multi-layer ceramic capacitor 1 is also connected to the mount surface 101 of the substrate 100 by the solder H at the first and second external electrodes 14 and 15.

However, in the multi-layer ceramic capacitor 1, it is difficult for the solder H to wet up to the regions covered with the covering portion 20 at the first and second external electrodes 14 and 15. The wet-up of the solder H is blocked by the covering portion 20 covering the first and second external electrodes 14 and 15, and the fillets of the solder H stay at the height of the exposed portions 14a and 15a of the first and second external electrodes 14 and 15. In other words, the amount of wet-up of the solder H at the first and second external electrodes 14 and 15 can be suppressed to be small.

As described above, in the multi-layer ceramic capacitor 1, the amount of wet-up of the solder H at the first and second external electrodes 14 and 15 is small, so that the amount of wet spread of the solder H on the mount surface 101 of the substrate 100 is also small. Thus, in the multi-layer ceramic capacitor 1, the mount space can be reduced compared to the simple chip 10.

As a result, miniaturization of the substrate 100 on which the multi-layer ceramic capacitor 1 is mounted, and high integration of an electronic component including the multi-layer ceramic capacitor 1 on the substrate 100 are enabled.

As an example, the simple chip 10 and the multi-layer ceramic capacitor 1 were compared to each other in number mountable in a mount space having the size of 12.4 mm×11.5 mm. An interval between the fillets of the solder H was set to 200 μm.

The comparison revealed that 63 (7×9) simple chips 10 can be mounted in the mount space whereas 117 (9×13) multi-layer ceramic capacitors 1 can be mounted in the mount space. In other words, it was found that the number of multi-layer ceramic capacitors 1 mountable in the mount space increases by 85.7% compared to the number of simple chips 10.

Further, as described above, in the multi-layer ceramic capacitor 1, the first and second external electrodes 14 and 15 are exposed to relatively high positions at the corners C. Thus, the amount of wet-up of the solder H at the first and second external electrodes 14 and 15 is relatively large at the corners C. In association with this, the amount of wet spread of the solder H on the mount surface 101 of the substrate 100 is relatively large at the corners C.

As a result, at the corners C of the multi-layer ceramic capacitor 1, a joint area of the solder H at the first and second external electrodes 14 and 15 and a joint area of the solder H on the mount surface 101 of the substrate 100 are increased. Thus, in the multi-layer ceramic capacitor 1, an especially high joint strength of the first and second external electrodes 14 and 15 with respect to the mount surface 101 of the substrate 100 is obtained at the corners C.

Here, in the multi-layer ceramic capacitor 1 mounted on the mount surface 101 of the substrate 100, stress involved in external impacts, thermal deformation, and the like in a production process or usage is likely to be concentrated at the corners C. In this regard, in the multi-layer ceramic capacitor 1, an especially high joint strength of the first and second external electrodes 14 and 15 with respect to the mount surface 101 of the substrate 100 is obtained at the corners C. Thus, high durability is provided. Therefore, in the circuit substrate including the multi-layer ceramic capacitor 1, high reliability is provided.

It should be noted that the configuration of the covering portion 20 can be changed as appropriate.

For example, the dimensions $t_0$ and $t_1$ of the covering portion 20 in the Z-axis direction at the first and second external electrodes 14 and 15 of the multi-layer ceramic capacitor 1 can be determined as appropriate.

When the dimensions $t_0$ and $t_1$ of the covering portion 20 in the Z-axis direction are increased, the exposed portions 14a and 15a of the first and second external electrodes 14 and 15 are lowered. This can suppress the mount area of the multi-layer ceramic capacitor 1 to be small. From this viewpoint, the dimensions $t_0$ and $t_1$ are desirably set such that the height of the exposed portions 14a and 15a of the first and second external electrodes 14 and 15 in the Z-axis direction is 150 μm or less.

Conversely, when the joint strength of the multi-layer ceramic capacitor 1 with respect to the mount surface 101 of the substrate 100 needs to be increased more, it is effective to reduce the dimensions $t_0$ and $t_1$ of the covering portion 20 in the Z-axis direction.

Further, in the multi-layer ceramic capacitor 1, the covering portion 20 only needs to be capable of blocking the wet-up of the solder H at the first and second external electrodes 14 and 15. The covering portion 20 may be broken at portions other than the bottom in the Z-axis direction, and the chip 10 may be exposed. Specifically, even when the chip 10 is exposed on the upper side of the covering portion 20 in the Z-axis direction (particularly at the corners), at which the covering portion 20 is likely to be thin in the production process of the multi-layer ceramic capacitor 1, the effect of reducing the mount space for the multi-layer ceramic capacitor 1 is not impaired.

Additionally, in the multi-layer ceramic capacitor 1, the covering portion 20 may partially come around the second main surface M2. In this case, the thickness of the covering portion 20 on the second main surface M2 is desirably set to be smaller than the sum of the thickness of each of the first and second external electrodes 14 and 15 on the second main surface M2 and the thickness of the solder H.

3. Method of Producing Multi-Layer Ceramic Capacitor 1

Figure 11:
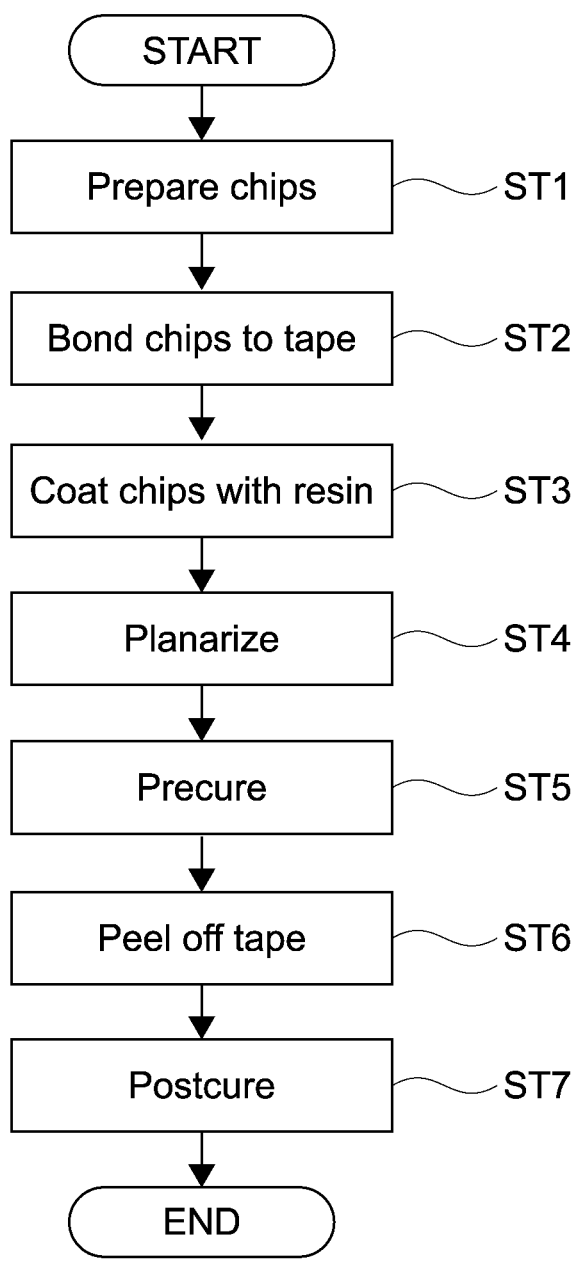
FIG. 11 is a flowchart showing a method of producing the multi-layer ceramic capacitor.

FIG. 11 is a flowchart showing an example of a method of producing the multi-layer ceramic capacitor 1. FIGS. 12 to 17 are views showing the production process of the multi-layer ceramic capacitor 1. Hereinafter, a method of producing the multi-layer ceramic capacitor 1 will be described along FIG. 11 with reference to FIGS. 12 to 17 as appropriate.

3.1 Step ST1: Chip Preparing Step

In Step ST1, the chips 10 shown in FIG. 2 are prepared. A method of producing the chip 10 can be selected from known methods and is not limited to a specific method.

3.2 Step ST2: Tape Bonding Step

In Step ST2, the second main surfaces M2 of the chips 10 prepared in Step ST1 are bonded to a tape T.

Figure 12:
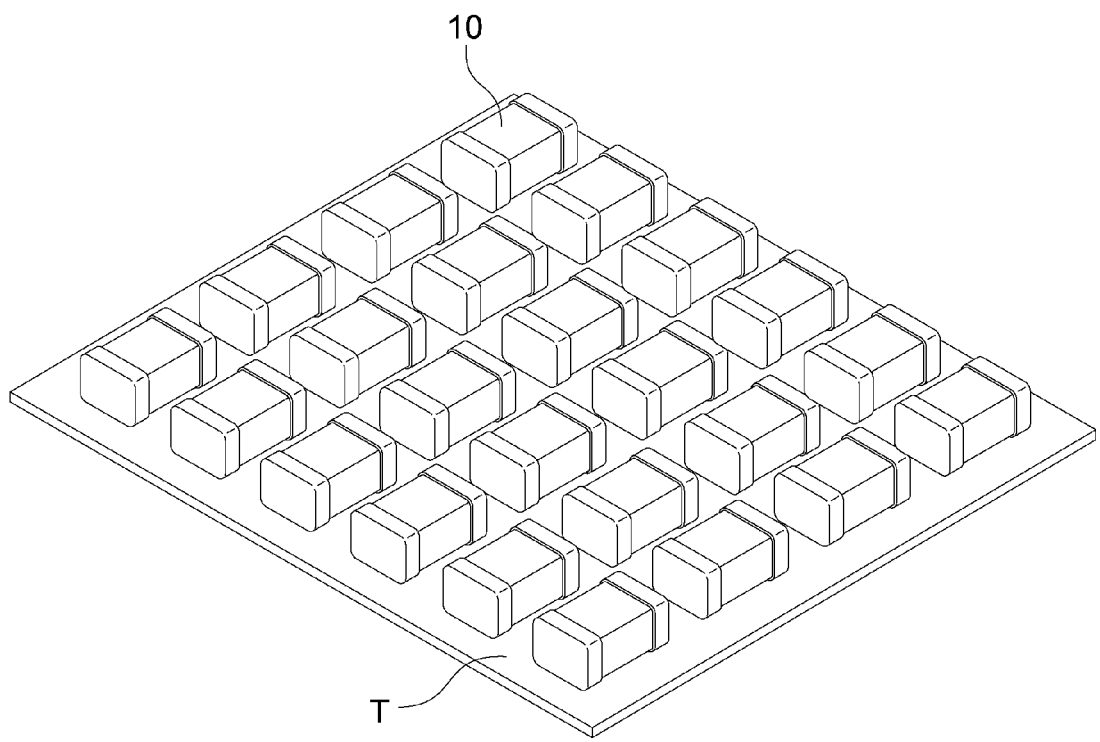
FIG. 12 is a view showing a tape bonding step in the method of producing the multi-layer ceramic capacitor.
Figure 12:
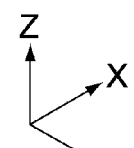

FIG. 12 shows a state where the chips 10 are bonded to the tape T in Step ST2. In Step ST2, the multiple chips 10 are bonded to a single tape T, and those chips 10 can thus be simultaneously subjected to subsequent steps.

In Step ST2, when the multiple chips 10 are bonded to a single tape T, the orientations of the chips 10 are desirably made identical to one another as shown in FIG. 12. This facilitates an examination on the orientations of the chips 10 bonded to the tape T. In Step ST2, for example, use of a magnet enables the first and second external electrodes 14 and 15 of the chips 10 to be oriented in a single direction.

For the tape T, a tape capable of successfully holding the chips 10 and successfully peeling off the chips 10 can be used.

In particular, it is further desirable that the tape T have an adhesive force sufficient to hold the chips 10 and be capable of reducing the adhesive force when the chips 10 are peeled off from the tape T. For such a tape T, for example, a foam tape or a UV (UltraViolet) tape can be used.

3.3 Step ST3: Resin Coating Step

In Step ST3, the chips 10 bonded to the tape T in Step ST2 are coated with an uncured resin 20a. The type of the uncured resin 20a can be selected in accordance with the configuration of the covering portion 20.

In Step ST3, a dip coating method capable of facilitating coating of the chips 10 with the uncured resin 20a is used.

Figure 13A:
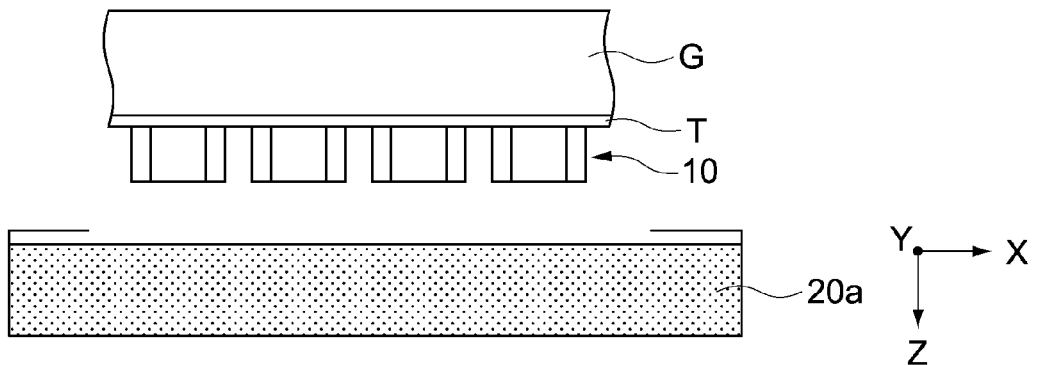
FIG. 13A is a view showing a coating step in the method of producing the multi-layer ceramic capacitor.
Figure 13B:
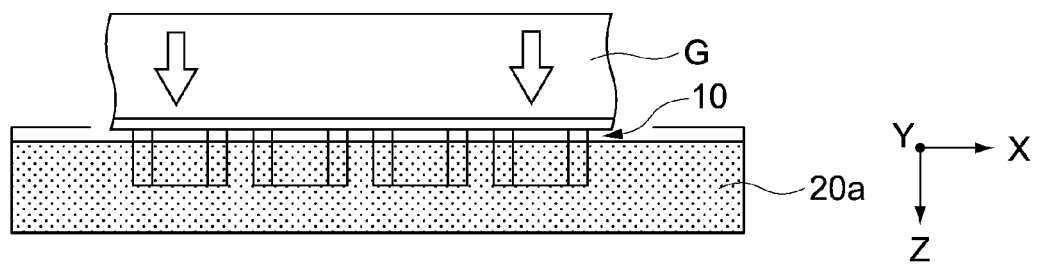
FIG. 13B is a view showing the coating step in the method of producing the multi-layer ceramic capacitor.
Figure 13C:
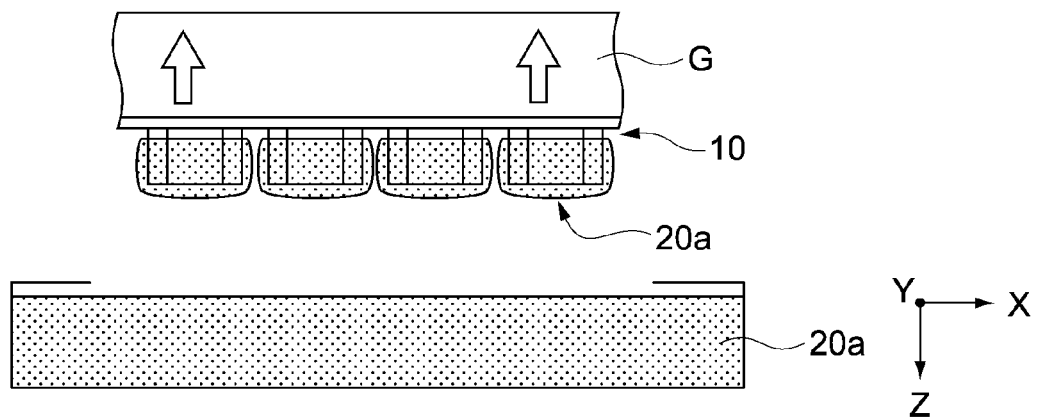
FIG. 13C is a view showing the coating step in the method of producing the multi-layer ceramic capacitor.

FIGS. 13A, 13B, and 13C are schematic views showing one example of a dip coating method in Step ST3.

In the dip coating method, as shown in FIG. 13A, a surface of the tape T, which is opposite to the surface on which the chips 10 are bonded, is first fixed to a holding plate G. The holding plate G is then disposed such that the chips 10 face down in the Z-axis direction, so that the chips 10 are caused to face a bath containing the uncured resin 20a.

Next, as shown in FIG. 13B, the holding plate G is moved down in the Z-axis direction to immerse the chips 10 in the uncured resin 20a.

At that time, the height of the holding plate G is kept such that the tape T does not come into contact with the uncured resin 20a. The tape T is prevented from coming into contact with a liquid level of the uncured resin 20a.

As shown in FIG. 13C, the chips 10 are then pulled out of the uncured resin 20a upward in the Z-axis direction. At that time, the uncured resin 20a attaches to the surface of each chip 10, and the chip 10 is coated with the uncured resin 20a.

Further, a gap is generated between the tape T and the uncured resin 20a. Thus, a portion of the chip 10 on the second main surface M2 is not coated with the uncured resin 20a, so that the exposed portions 14a and 15a of the first and second external electrodes 14 and 15 are formed.

Figure 14:
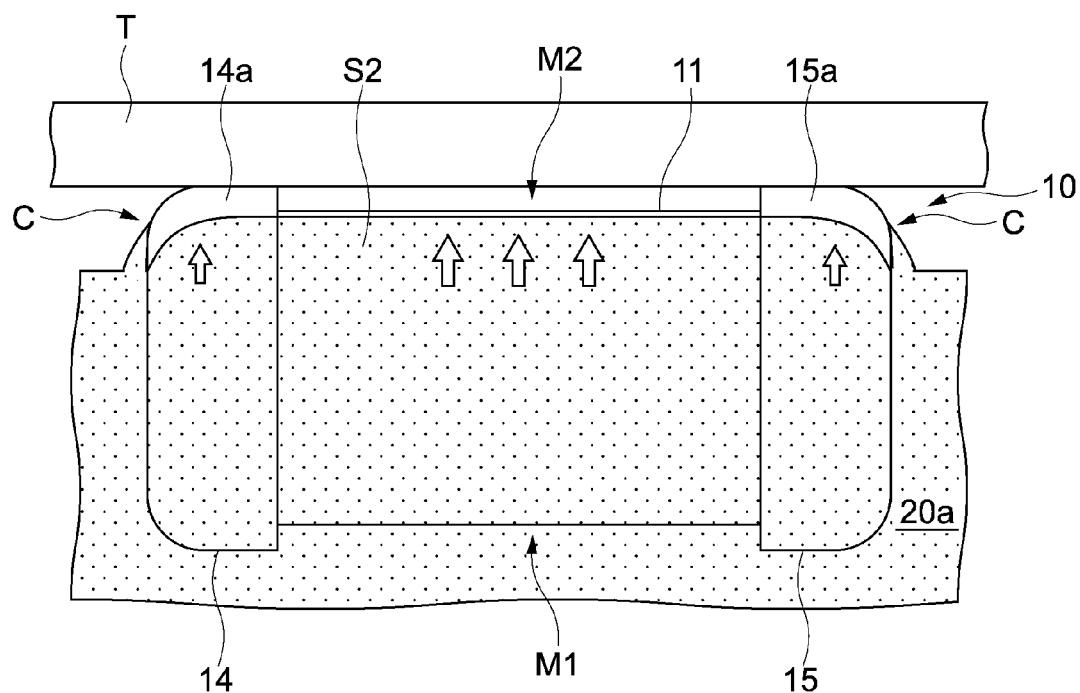
FIG. 14 is a view showing a behavior of an uncured resin in the coating step.

FIG. 14 is a view showing a behavior of the uncured resin 20a when the chip 10 is being immersed in the uncured resin 20a in FIG. 13B.

An operation of a surface tension of the uncured resin 20a causes the uncured resin 20a to be lifted in the Z-axis direction along the chip 10. In other words, because an interfacial tension between the chip 10 and the uncured resin 20a is smaller than an interfacial tension between the chip 10 and air, the uncured resin 20a is lifted in such a manner that the difference between those interfacial tensions is cancelled.

The operation that the uncured resin 20a is lifted in the Z-axis direction along the chip 10 is reduced at the corners C more than at portions other than the corners C. Thus, the height of the uncured resin 20a in the Z-axis direction at the corners C is lower than the height at portions other than the corners C. As a result, the covering portion 20 obtained after the uncured resin 20a is cured has a form recessed upward in the Z-axis direction at the corners C, as shown in FIGS. 3 to 7.

The lifted amount of the uncured resin 20a in the chip 10 is controllable based on viscosity of the uncured resin 20a, for example.

Specifically, use of the uncured resin 20a having low viscosity prompts the operation that the uncured resin 20a is lifted along the chip 10. In this case, the difference in height of the uncured resin 20a in the Z-axis direction between the corners C and the portions other than the corners C can be made large.

Conversely, use of the uncured resin 20a having high viscosity suppresses the operation that the uncured resin 20a is lifted along the chip 10 to be small. In this case, the difference in height of the uncured resin 20a in the Z-axis direction between the corners C and the portions other than the corners C can be made small.

Figure 15:
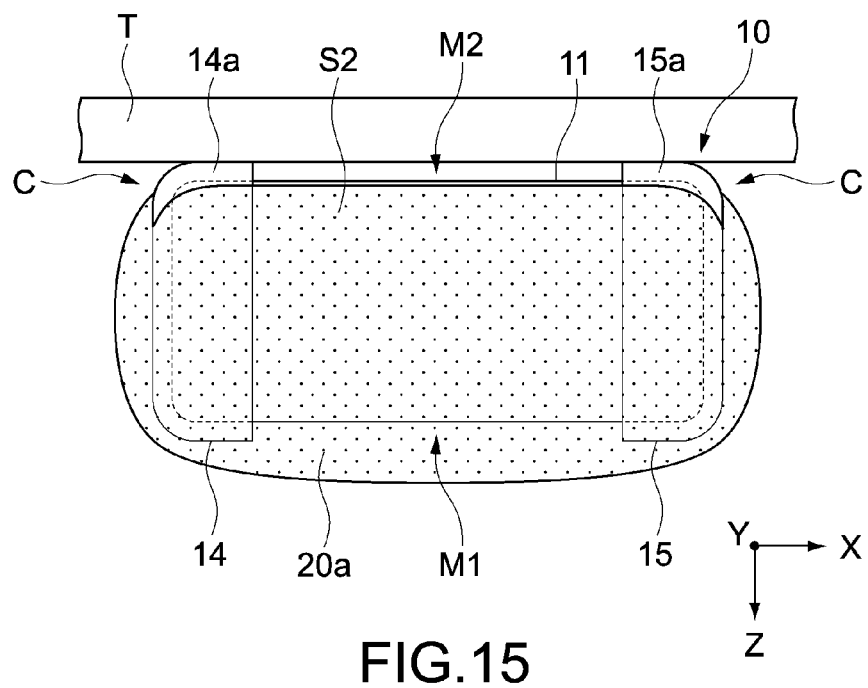
FIG. 15 is a view showing a chip after being subjected to the coating step.

FIG. 15 shows the chip 10 coated with the uncured resin 20a after Step ST3. In the chip 10 shown in FIG. 15, the uncured resin 20a on the first main surface M1 is convexly raised. When the uncured resin 20a is cured in this state, the covering portion 20 is formed into a curved shape raised on the first main surface M1. This makes it difficult to hold the first main surface M1 of the multi-layer ceramic capacitor 1 by suction and to perform mounting accordingly.

Further, in the state shown in FIG. 15, the uncured resin 20a on the first main surface M1 is thick, and thus the covering portion 20 obtained after the uncured resin 20a is cured is also thick. As a result, the height of the multi-layer ceramic capacitor 1 increases in the Z-axis direction. This makes it difficult to apply the multi-layer ceramic capacitor 1 to thin electronic devices, for example.

In order to eliminate those above-mentioned defects, the following Step ST4 is performed.

3.4 Step ST4: Planarization Step

In Step ST4, a flat surface F is formed on the uncured resin 20a applied to the chip 10 in Step ST3.

Figure 16A:
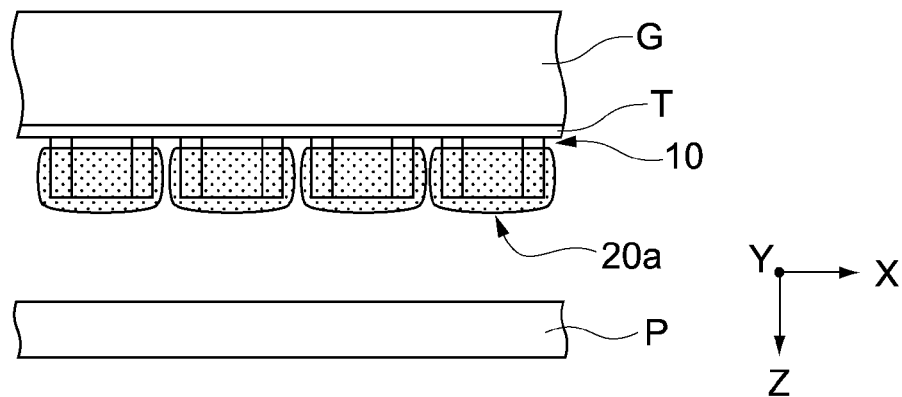
FIG. 16A is a view showing a planarization step in the method of producing the multi-layer ceramic capacitor.
Figure 16B:
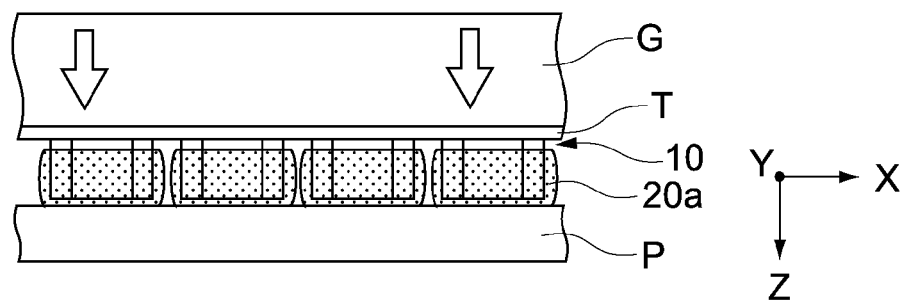
FIG. 16B is a view showing the planarization step in the method of producing the multi-layer ceramic capacitor.
Figure 16C:
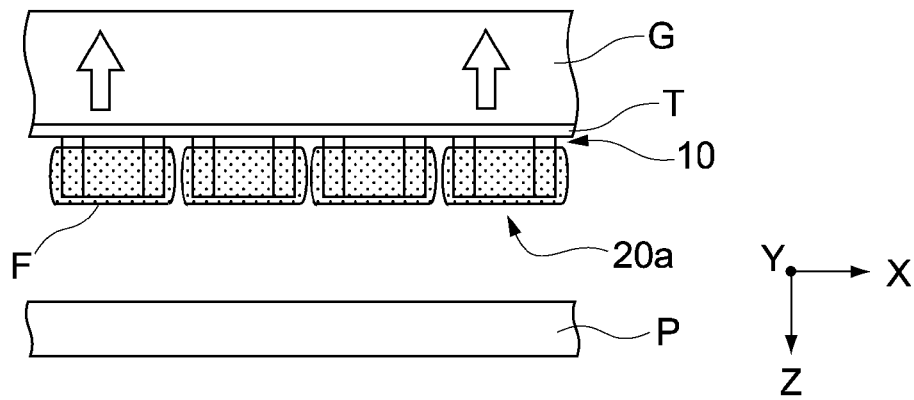
FIG. 16C is a view showing the planarization step in the method of producing the multi-layer ceramic capacitor.

FIGS. 16A, 16B, and 16C are schematic views showing an exemplary flow of Step ST4.

First, as shown in FIG. 16A, the holding plate G is disposed such that the chips 10 face down in the Z-axis direction, so that the chips 10 are caused to face a flat plate P.

Next, as shown in FIG. 16B, the holding plate G is moved down in the Z-axis direction to press the uncured resins 20a on the first main surfaces M1 of the chips 10 against the surface of the flat plate P. As a result, unnecessary uncured resins 20a are caused to attach to the surface of the flat plate P.

As shown in FIG. 16C, the holding plate G is then pulled up in the Z-axis direction. As a result, the uncured resins 20a on the first main surfaces M1 are made thin, and the flat surfaces F are formed on the uncured resins 20a at the same time, so that the uncured resins 20a each have a shape of the covering portion 20 shown in FIGS. 3 to 7.

3.5 Step ST5: Precuring Step

In Step ST5, the uncured resins 20a provided with the flat surfaces F in Step ST4 are precured, and precured resins 20b are obtained.

In Step ST5, the chips 10 bonded to the tape T are heated at a temperature lower than a curing temperature for the uncured resins 20a, the curing temperature being appropriate for the heat resistance of the tape T. Through the heating, the uncured resins 20a are not completely cured but not easily deformed, and obtain reduced adhesion properties of the surfaces.

3.6 Step ST6: Tape Peeling Step

In Step ST6, the chips 10 coated with the precured resins 20b precured in Step ST5 are peeled off from the tape T and then collected.

Figure 17:
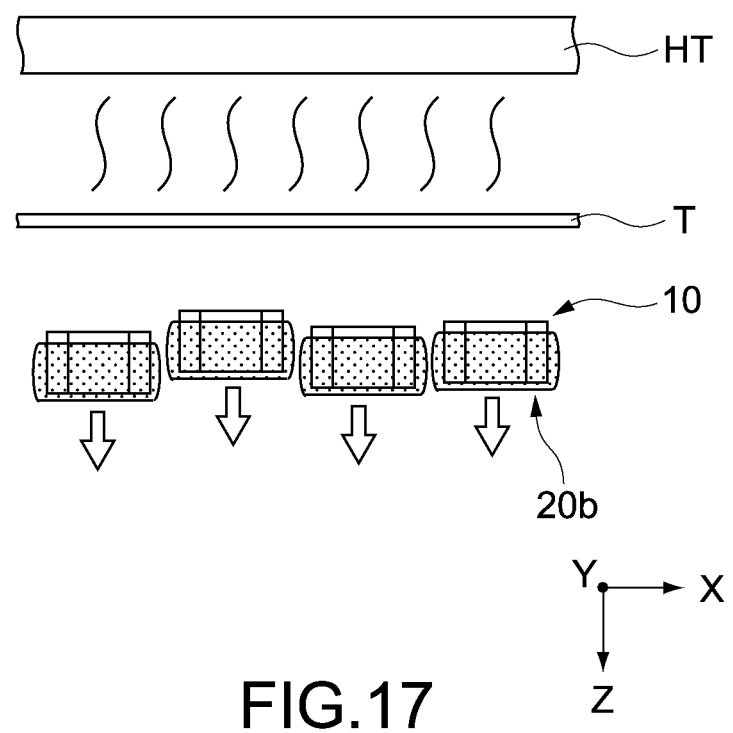
FIG. 17 is a view showing a tape peeling step in the method of producing the multi-layer ceramic capacitor.

FIG. 17 is a view for describing Step ST6. In Step ST6, the adhesion properties of the tape T is reduced, and the chips 10 are then collected. When a foam tape is used for the tape T, the tape T is heated with a heater HT, and the chips 10 are then collected. When a UV tape is used for the tape T, the tape T is irradiated with ultraviolet rays, and the chips 10 are then collected.

If the chips 10 coated with the uncured resins 20a are collected without being subjected to Step ST5, the uncured resins 20a may be deformed due to physical shocks and the like, or the chips 10 may adhere to one another due to the adhesion properties of the uncured resins 20a. In this regard, the chips 10 coated with the precured resins 20b precured in Step ST5 can eliminate the problems described above.

Further, in Step ST3 described above, since the tape T is prevented from coming into contact with a liquid level of the uncured resin 20a, the tape T and the precured resins 20b do not adhere to each other in Step ST6. This can prevent the chips 10 from being hardly collected from the tape T due to the adhesion of the tape T and the precured resins 20b, and prevent burrs of the precured resins 20b from being generated when the chips 10 are peeled off from the tape T.

3.7 Step ST7: Postcuring Step

In Step ST7, the precured resins 20b, which coat the chips 10 peeled off from the tape T in Step ST6, are postcured.

In Step ST7, since the chips 10 are already peeled off from the tape T, irrespective of the heat resistance of the tape T, the precured resins 20b can be sufficiently cured by being held at the curing temperature for the uncured resins 20a for a predetermined period of time.

Through the above steps, the multi-layer ceramic capacitor 1 is completed.

4. Other Embodiments

As described above, the embodiment of the present invention has been described, but the present invention is not limited to the embodiment described above and can be variously modified as a matter of course.

For example, the configuration in which the mount space is reduced by covering with the covering portion according to the embodiment described above is not limited to the multi-layer ceramic capacitor and can be widely used for electronic components including a pair of external electrodes facing each other. Examples of such electronic components include an inductor, a resistive element, and a piezoelectric element.

Further, the method of coating the chips with the uncured resin in Step ST3 of FIG. 11 is not limited to the dip coating method and can be selected as appropriate. In Step ST3, the uncured resin may be applied to the chips by a printing method, for example.

What is claimed is:

1. An electronic component, comprising:
    a chip having
        a first end surface and a second end surface, the first end surface and the second end surface being oriented in a direction of a first axis,
        a first main surface and a second main surface, the first main surface and the second main surface being oriented in a direction of a second axis orthogonal to the first axis,
        a first side surface and a second side surface, the first side surface and the second side surface being oriented in a direction of a third axis orthogonal to the first axis and the second axis, and
        a first external electrode and a second external electrode, the first external electrode and the second external electrode respectively covering the first end surface and the second end surface and each extending to the first main surface, the second main surface, the first side surface, and the second side surface;
    a covering portion, the covering portion covering the chip from the first main surface toward the second main surface; and
    exposed portions, the exposed portions being provided to the second main surface of the chip, including regions where the first external electrode and the second external electrode are exposed without being covered with the covering portion, and being pushed out toward the first main surface at a plurality of corners connecting the first and second end surfaces to the first and second side surfaces more than they are pushed out at centers of the first and second end surfaces.

2. The electronic component according to claim 1, wherein
    the covering portion covers an entire region of the first main surface and exposes an entire region of the second main surface.

3. The electronic component according to claim 1, wherein
    the covering portion has a flat surface on the first main surface, the flat surface being perpendicular to the second axis.

4. The electronic component according to claim 1, wherein
    the chip further includes first internal electrodes and second internal electrodes, the first internal electrodes being connected to the first external electrode, the second internal electrodes being connected to the second external electrode, the first internal electrodes and the second internal electrodes being alternately disposed along the second axis.

5. The electronic component according to claim 1, wherein
    a solder does not wet up on the covering portion.

6. A circuit substrate, comprising:
    a substrate having a mount surface; and
    an electronic component mounted on the mount surface, the electronic component including
        a chip having
            a first end surface and a second end surface, the first end surface and the second end surface being oriented in a direction of a first axis,
            a first main surface and a second main surface, the first main surface and the second main surface being oriented in a direction of a second axis orthogonal to the first axis,
            a first side surface and a second side surface, the first side surface and the second side surface being oriented in a direction of a third axis orthogonal to the first axis and the second axis, and
            a first external electrode and a second external electrode, the first external electrode and the second external electrode respectively covering the first end surface and the second end surface and each extending to the first main surface, the second main surface, the first side surface, and the second side surface,
        a covering portion, the covering portion covering the chip from the first main surface toward the second main surface, and
        exposed portions, the exposed portions being provided to the second main surface of the chip, including regions where the first external electrode and the second external electrode are exposed without being covered with the covering portion, and being pushed out toward the first main surface at a plurality of corners connecting the first and second end surfaces to the first and second side surfaces more than they are pushed out at centers of the first and second end surfaces, wherein the second main surface being is disposed to face the mount surface, and the first external electrode and the second external electrode are soldered to the mount surface at the exposed portions.

\* \* \* \* \*